(12) United States Patent
Nagatsu

(10) Patent No.: US 12,439,566 B2
(45) Date of Patent: Oct. 7, 2025

(54) ELECTRONIC APPARATUS

(71) Applicant: CANON KABUSHIKI KAISHA, Tokyo (JP)

(72) Inventor: Sho Nagatsu, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 281 days.

(21) Appl. No.: 18/453,571

(22) Filed: Aug. 22, 2023

(65) Prior Publication Data

US 2024/0074115 A1 Feb. 29, 2024

(30) Foreign Application Priority Data

Aug. 30, 2022 (JP) ................. 2022-137282

(51) Int. Cl.
*H05K 7/20* (2006.01)
*G03B 17/55* (2021.01)

(52) U.S. Cl.
CPC ......... *H05K 7/20509* (2013.01); *G03B 17/55* (2013.01); *H05K 7/20454* (2013.01); *H05K 7/20472* (2013.01)

(58) Field of Classification Search
None
See application file for complete search history.

(56) References Cited

U.S. PATENT DOCUMENTS

| 9,743,554 | B2* | 8/2017 | McLaughlin | ........ H05K 7/2039 |
| 2018/0107099 | A1* | 4/2018 | Yasuda | .................. G03B 17/55 |
| 2021/0377431 | A1* | 12/2021 | Oyama | .................. H04N 23/52 |

FOREIGN PATENT DOCUMENTS

| JP | 2005-129734 A | 5/2019 |
| JP | 6981610 B2 | 12/2021 |

* cited by examiner

*Primary Examiner* — Mukundbhai G Patel
(74) *Attorney, Agent, or Firm* — Cowan, Liebowitz & Latman, P.C.

(57) ABSTRACT

An electronic apparatus includes an exterior member, a first electronic component and a second electronic component each provided inside the exterior member, a sheet metal provided inside the exterior member and spaced from each of the first electronic component and the second electronic component, a first heat conductive member provided inside the exterior member and including a first connector thermally connected to the second electronic component and a second connector thermally connected to the sheet metal, and an elastic member provided inside the exterior member and between the first electronic component and the sheet metal and having a thermal conductivity lower than that of the first heat conductive member. The second connector is pressed against the sheet metal by an elastic force of the elastic member.

8 Claims, 5 Drawing Sheets

ELECTRONIC APPARATUS

BACKGROUND

Technical Field

One of the aspects of the embodiments relates to a heat radiating structure in an electronic apparatus, such as an image pickup apparatus.

Description of Related Art

An image pickup apparatus, such as a digital camera, includes an image sensor configured to convert an object image captured through an imaging lens into a digital image. A signal output from the image sensor is processed by an image engine mounted on a main substrate in the image pickup apparatus. In this image engine, the temperature may rise to its own permissible upper limit temperature due to heat generated during operation. It is thus necessary to sufficiently and properly radiate the heat generated by the image engine.

Japanese Patent No. 6981610 discloses a heat radiating structure including a heat radiating member that radiates heat generated in an electronic component through an insulating sheet. Japanese Patent Laid-Open No. 2005-129734 discloses a heat radiating structure that includes a sheet-like heat conductive member that contacts a heat generating component, and an elastic member disposed between the heat conductive member and an inner surface of a housing.

The heat radiating structure disclosed in Japanese Patent No. 6981610 radiates heat in the same manner from a plurality of heat generating electronic components, and thus the permissible upper limit temperature of one of the electronic components tends to limit the operation of the other electronic components. The heat radiating structure disclosed in Japanese Patent Laid-Open No. 2005-129734 does not consider the permissible upper limit temperature of the heat generating components, and the heat generated by other heat generating components may limit the operation.

SUMMARY

An electronic apparatus according to one aspect of the disclosure includes an exterior member, a first electronic component and a second electronic component each provided inside the exterior member, a sheet metal provided inside the exterior member and spaced from each of the first electronic component and the second electronic component, a first heat conductive member provided inside the exterior member and including a first connector thermally connected to the second electronic component and a second connector thermally connected to the sheet metal, and an elastic member provided inside the exterior member and between the first electronic component and the sheet metal and having a thermal conductivity lower than that of the first heat conductive member. The second connector is pressed against the sheet metal by an elastic force of the elastic member.

Further features of the disclosure will become apparent from the following description of embodiments with reference to the attached drawings.

DESCRIPTION OF THE EMBODIMENTS

Referring now to the accompanying drawings, a description will be given of embodiments according to the disclosure.

Figures 1A, 1B:
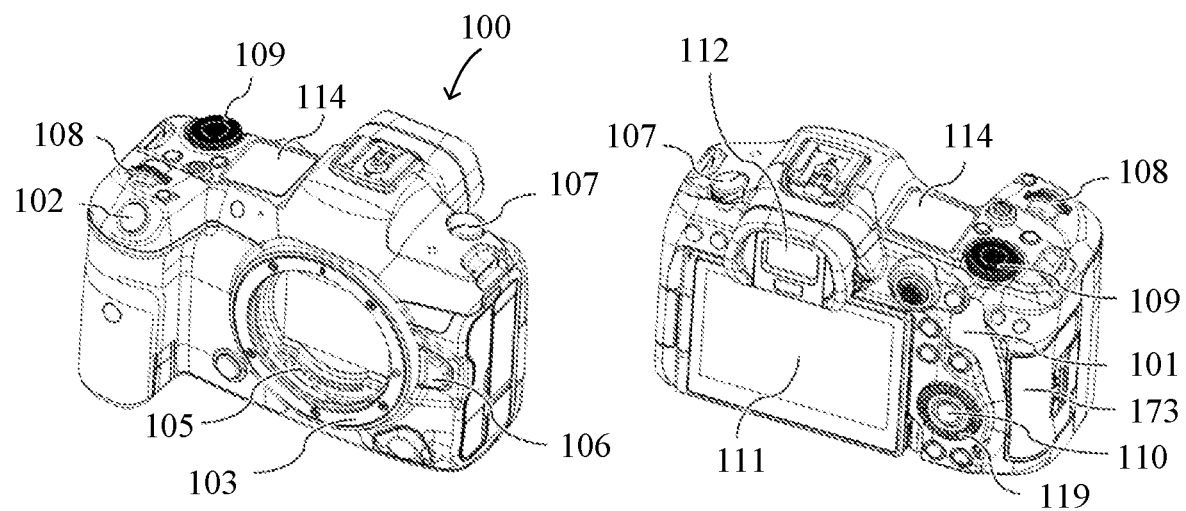
FIGS. 1a and 1b are external perspective views of an image pickup apparatus according to this embodiment.

FIGS. 1a and 1b are front and rear perspective views of the external appearance of a camera body (electronic apparatus, image pickup apparatus) 100 according to this embodiment.

Provided on a rear right portion of the camera body 100 is a held portion 101 placed by the right thumb of the user in holding the camera body 100. Provided on an upper right front portion of the camera body 100 is a shutter button 102 operable by the right index finger of the user instructing the start of imaging.

Figure 2:
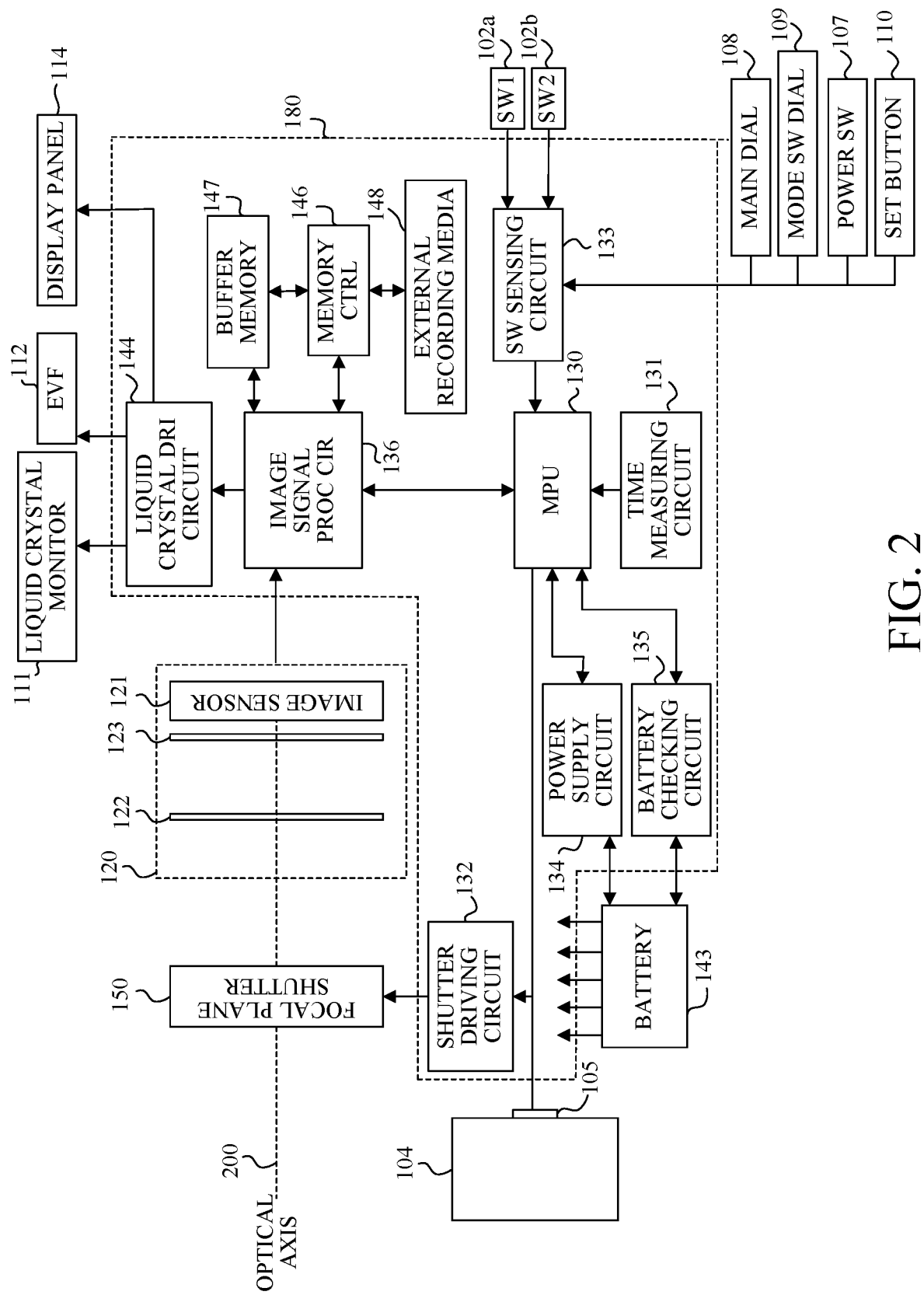
FIG. 2 is a block diagram illustrating an electrical configuration of the image pickup apparatus according to this embodiment.

A lens mount 103 is provided on a front surface of the camera body 100. A lens unit 104 illustrated in FIG. 2 is attachable to and detachable from the lens mount 103. The camera body 100 and the lens unit 104 are electrically connected via a mount contact 105 provided on the lens mount 103, and power is supplied from the camera body 100 to the lens unit 104 and communication is performed between the camera body 100 and the lens unit 104.

A power switch 107 operable by the user to power on and off the camera body 100 is provided on an upper left portion of the camera body 100. A main electronic dial 108 and a subsidiary electronic dial 119 to be rotated in a case where the user changes various setting values such as an F-number (aperture value) and a shutter speed are provided on a top right portion and a rear lower right portion of the camera body 100, respectively. A set button 110 is provided at the center of the subsidiary electronic dial 119 and is operated by the user mainly in determining setting values and the like.

A mode switching dial 109 is provided on an upper right portion of the camera body 100 and is rotated in a case where the user switches an imaging mode. The imaging modes include a shutter speed priority mode, an F-number priority mode, a moving image imaging mode, and the like.

Provided on a rear surface of the camera body 100 is a rear monitor 111 including a screen for various settings, a liquid crystal display for displaying a live-view image, a captured image, and the like. An electronic viewfinder 112 is provided above the rear monitor 111 on the rear surface of the camera body 100 so that the user can view a display similar to the rear monitor 111 by eye approaching. A display panel 114 is provided on the top surface of the camera body 100 to display a variety of settings such as the imaging mode and ISO speed.

A media slot lid 173 that can be opened and closed is provided on the right side surface of the camera body 100. While the media slot lid 173 is opened, an external recording medium 148 illustrated in FIG. 2 can be inserted into and ejected from an internal media slot (not illustrated).

FIG. 2 illustrates an electrical configuration of the camera body 100. An MPU 130 is a microcomputer (controller) configured to control the operation of the camera body 100.

A time measuring circuit 131, a shutter driving circuit 132, a switch sensing circuit 133, a power supply circuit 134, a battery checking circuit 135, and an image signal processing circuit 136 are connected to the MPU 130. The MPU 130 can store time information from the time measuring circuit 131 and various setting information in a built-in EEPROM. The MPU 130 communicates with the lens unit 104 via the mount contact 105 to control the operation of the lens unit 104.

A focal plane shutter 150 is driven by the shutter driving circuit 132. In a case where the user operates the shutter button 102, a front curtain runs and the shutter opens, and in a case where a predetermined exposure time elapses, a rear curtain runs and the shutter closes. Thereby, the exposure time of the image sensor 121 is controlled.

The imaging unit 120 is a unit that includes an optical low-pass filter 122, a filter holding member 123 holding this, and the image sensor 121. The image sensor 121 is a photoelectric conversion element that photoelectrically converts an object image formed by the imaging optical system in the lens unit 104, and includes a CMOS sensor, a CCD sensor, or the like.

The image signal processing circuit 136 performs image processing such as filter processing and color conversion processing for an electrical signal (imaging signal) output from the image sensor 121 to generate image data. Image data from the image signal processing circuit 136 is displayed on the rear monitor 111 and the electronic viewfinder 112 via the liquid crystal driving circuit 144. The image signal processing circuit 136 can also store image data in a buffer memory 147 through a memory controller 146 according to an instruction from the MPU 130. The image signal processing circuit 136 can also perform processing for compressing image data using the j peg method or the like.

The memory controller 146 has a function of storing image data in the external recording medium 148 and reading out image data stored in the external recording medium 148. As the external recording medium 148, a memory card or the like that can be inserted into and ejected from the camera body 100 is used.

The switch sensing circuit 133 receives an imaging preparation signal output from a switch SW1 (102a) in a case where the shutter button 102 is half-pressed and an imaging start signal output from the switch SW2 (102b) in a case where the shutter button 102 is fully pressed. The MPU 130 executes imaging preparation processing such as auto-exposure (AE) and autofocus (AF) according to the imaging preparation signal. The MPU 130 executes imaging processing such as opening/closing operation of the focal plane shutter 150 and generation of recording image data from the imaging signal output from the image sensor 121 according to the imaging start signal. The switch sensing circuit 133 is also connected to the main electronic dial 108, the mode switching dial 109, the power switch 107, and the set button 110, and transmits signals from these to the MPU 130.

The power supply circuit 134 supplies power from the battery 143 to each part inside the camera body 100 and the lens unit 104. The battery checking circuit 135 notifies the MPU 130 of remaining information of the battery 143 and the like.

Figure 3:
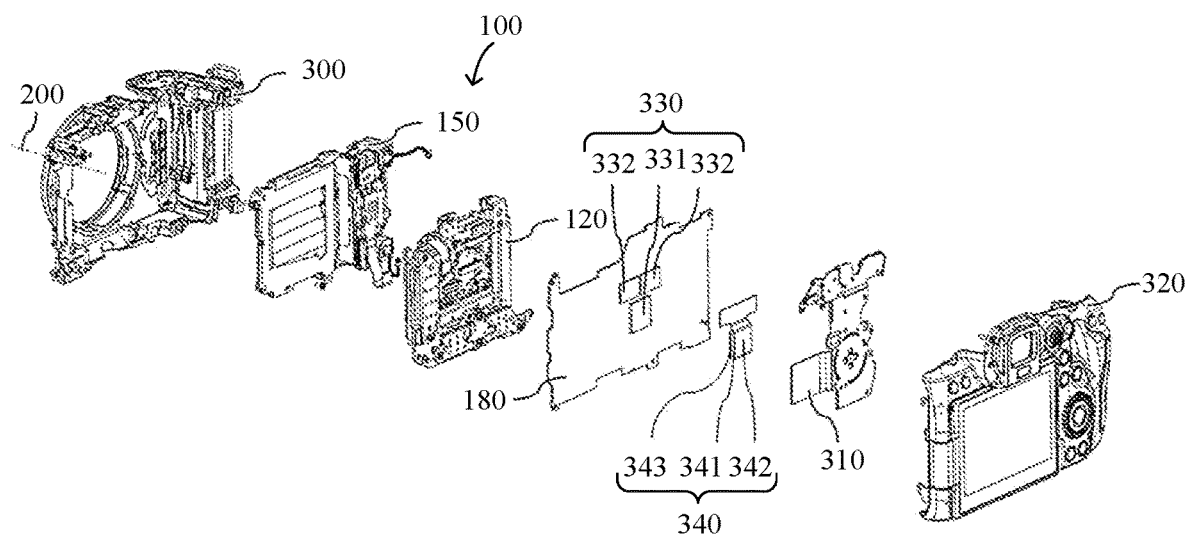
FIG. 3 is an exploded perspective view of the image pickup apparatus according to this embodiment.

FIG. 3 is an exploded view of the camera body 100 in a direction in which the optical axis 200 extends (optical axis direction). The camera body 100 has a structure in which a body base member 300 is covered with exterior members such as a rear cover 320 on the rear surface side, an unillustrated top cover on the upper side, and an unillustrated bottom cover on the lower side. The body base member 300 is made of a material such as magnesium alloy. The focal plane shutter 150, the imaging unit 120, the main substrate 180, and the rear cover 320 are attached to the main body base member 300 in this order from the front side (object side).

A first electronic component 331 and two second electronic components 332 are mounted on the main substrate 180 as an electronic component group 330 that serve as heat sources. The first electronic component 331 is an image engine forming the image signal processing circuit 136, and the second electronic components 332 include a DRAM as the buffer memory 147.

Provided to the electronic component group 330 are a heat conductive portion 340 that includes an elastic member 341 as an intermediate member, a first heat conductive member 342, and a second heat conductive member 343. The first heat conductive member 342 is thermally connected to the heat radiating member 310 and the heat radiating member 310 is attached to the rear cover 320.

Figure 4A:
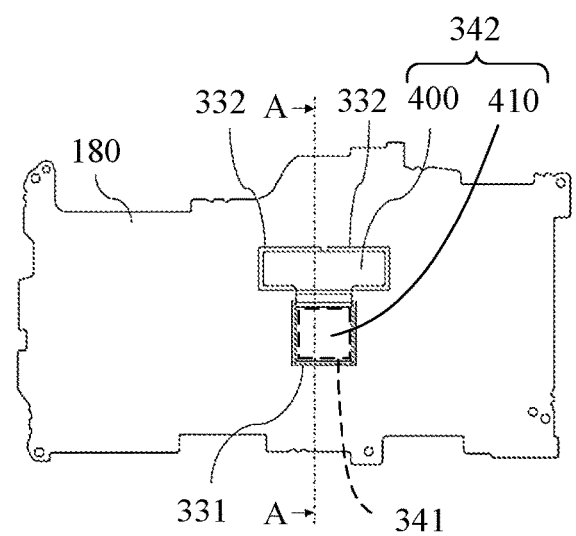
FIGS. 4A, 4B, and 4C illustrate a heat radiating structure in the image pickup apparatus according to this embodiment.
Figure 4B:
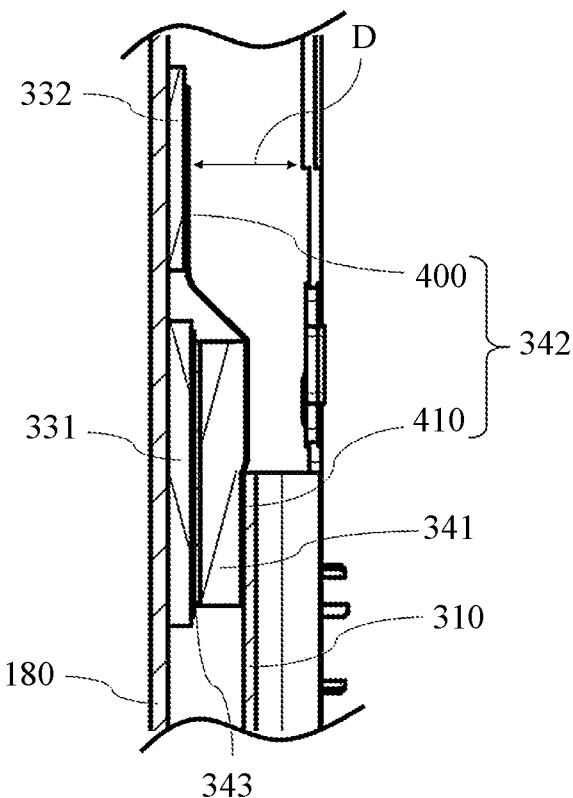
Figure 4C:
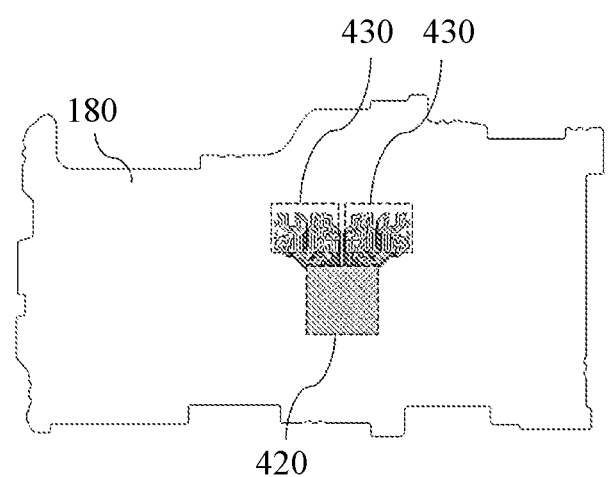

Referring now to FIGS. 4A, 4B, and 4C, a description will be given of the heat radiating structure of the electronic component group 330. FIG. 4A illustrates the main substrate 180 viewed from the rear surface side in the optical axis direction. FIG. 4B illustrates a section of the main substrate 180 taken along a line A-A in FIG. 4A. FIG. 4C illustrates a ground (GND) wiring 420 for the first electronic component 331 and an equal length wiring 430 for the two second electronic components 332 provided on the main substrate 180 viewed from the rear surface side.

The heat from the electronic component group 330 as a heat source may not be excessively transferred to the exterior members of the camera body 100 that the user touches, and the exterior members may not become hot. Thus, the first electronic component 331 is disposed at the central portion of the main substrate 180. The heat from the first electronic component 331 is more likely to diffuse over the entire main substrate 180 and less likely to transmit directly to the exterior member than the heat in a case where the first electronic component 331 is disposed at the end portion of the main substrate 180. The two second electronic components 332 are disposed at the central portion of the main substrate 180 and adjacent to each other laterally symmetrically with respect to the first electronic component 331.

As illustrated in FIG. 4A, the first heat conductive member 342 when viewed from the rear side has a shape that approximately entirely covers the front surfaces (rear surfaces) of the heat radiating member 310 on the first electronic component 331 and the two second electronic components 332. More specifically, the first heat conductive member 342 includes a first connector 400 that has a shape that substantially covers the surfaces of the two second electronic components 332, and a second connector 410 that has a shape that substantially covers the surface of the heat radiating member 310. As illustrated in FIG. 4B, the first connector 400 contacts and is thermally connected to the two second electronic components 332, and the second connector 410 contacts and is thermally connected to the heat radiating member 310.

The first heat conductive member 342 is a graphite sheet or the like having flexibility and thermal conductivity, the first connector 400 is fixed to the two second electronic components 332 and the second connector 410 is fixed to the elastic member 341 by an unillustrated adhesive material. The heat radiating member 310 is a sheet metal member made of a material such as aluminum. Heat from the second electronic component 332 is transferred to the heat radiating member 310 via the first heat conductive member 342 and then diffused to the rear cover 320.

Using a thin sheet-like heat conductive member such as a graphite sheet as the first heat conductive member 342 can widely secure a distance (spacing, interval) D between the first connector 400 of the first heat conductive member 342 and a portion of the heat radiating member 310 which faces the first connector 400. More specifically, the distance D is longer than a distance (0 to about d/2) between the second connector 410 and the heat radiating member 310. Thereby, the heat from the second electronic component 332 is less likely to directly transmit to the portion of the heat radiating member 310 that faces the first connector 400 and the rear cover 320 to which the heat radiating member 310 is attached, and the rear cover 320 which the user easily touches is less likely to get hot.

The second heat conductive member 343 having substantially the same shape as that of the first electronic component 331 when viewed from the rear side is disposed on the surface of the first electronic component 331. A graphite sheet or a metal foil sheet is used for the second heat conductive member 343. The first electronic component 331 does not entirely uniformly generate heat, and generates a heat spot near the center. Disposing the second heat conductive member 343 can reduce the heat spot in the first electronic component 331.

The elastic member 341 is disposed between the first electronic component 331 and the second connector 410 of the first heat conductive member 342. The elastic member 341 is an elastic member made of silicon rubber, urethane foam, or the like, and presses (biases) the second connector 410 of the first heat conductive member 342 against the heat radiating member 310 by an elastic force generated in a compressed (charged) state. The surface of the first electronic component 331 has a planar shape without unevenness, and the portion of the elastic member 341 where the second connector 410 of the first heat conductive member 342 contacts the heat radiating member 310 can be uniformly charged. This configuration can stably transfer to the heat radiating member 310 the heat transferred from the second electronic component 332 to the second connector 410 of the first heat conductive member 342. As described above, the second heat conductive member 343 has substantially the same shape as that of the first electronic component 331, so heat from the first electronic component 331 can be uniformly transferred to the elastic member 341.

This embodiment biases part of the second connector 410 of the first heat conductive member 342 toward the heat radiating member 310 by setting the elastic member 341 t the charged state. More specifically, about half the area of the elastic member 341 is in the charged state. Changing the position of the heat radiating member 310 can change the contact area between the heat radiating member 310 and the second connector 410 of the first heat conductive member 342, and adjust the heat transmitted to the heat radiating member 310.

In this embodiment, a heat amount generated by the first electronic component 331 is larger than that generated by the second electronic component 332. Each of the first electronic component 331 and the second electronic component 332 has a permissible upper limit temperature. The permissible upper limit temperature is a temperature that secures a predetermined margin from the guaranteed operating temperature of the electronic component. In a case where the temperature of one of the first electronic component 331 and the second electronic component 332 reaches the permissible upper limit temperature, the MPU 130 stops the operation of the camera body 100 in order to prevent performance deterioration of the camera body 100 and protect the circuit.

In this embodiment, the permissible upper limit temperature of the first electronic component 331 is higher than that of the second electronic component 332. The thermal conductivity of the elastic member 341 is lower than that of the first heat conductive member 342 (and the second heat conductive member 343, which will be described below). In other words, the elastic member 341 functions as a heat insulator.

The thickness and width of the first heat conductive member 342, which is a graphite sheet, are set so that the heat radiation amount of the second electronic component 332 becomes larger. The thermal conductivity, thickness, and width of the elastic member 341 are set so that the heat radiation amount from the elastic member 341 becomes smaller than that from the first heat conductive member 342. This setting can transfer more heat from the second electronic component 332 with a lower permissible upper limit temperature to the heat radiating member 310 than heat from the first electronic component 331 with a higher permissible upper limit temperature. Therefore, this setting can provide proper heat radiation to prevent the second electronic component 332 from reaching the permissible upper limit temperature earlier than the first electronic component 331 and prevent the camera body 100 from stopping its operation.

In FIG. 4C, the GND wiring 420 is planarly provided in an area of the main substrate 180 where the first electronic component 331 is mounted, and the equal length wiring 430 is provided in each of the areas where the two second electronic components 332 are mounted. is provided. Here, the remaining copper ratio of the wiring in the area on the main substrate 180 where the second electronic component 332 is mounted is smaller than that where the first electronic component 331 is mounted. Therefore, more heat from first electronic component 331 is transmitted to the main substrate 180 than heat from the second electronic component 332. Transmitting more heat from the first electronic component 331, which generates more heat, to the main substrate 180 can prevent excessive heat from transmitting to the rear cover 320 via the heat radiating member 310, and prevent the rear cover 320 (held portion 101) from getting hot.

In this embodiment, the intermediate member is an elastic member that presses the first heat conductive member 342 against the heat radiating member 310 in the charged state. As long as the thermal connection between the first heat conductive member 342 and the heat radiating member 310 can be reliably established, an intermediate member may be used which is disposed between the first heat conductive member 342 and the heat radiating member 310 without being in the charged state.

Figure 5A:
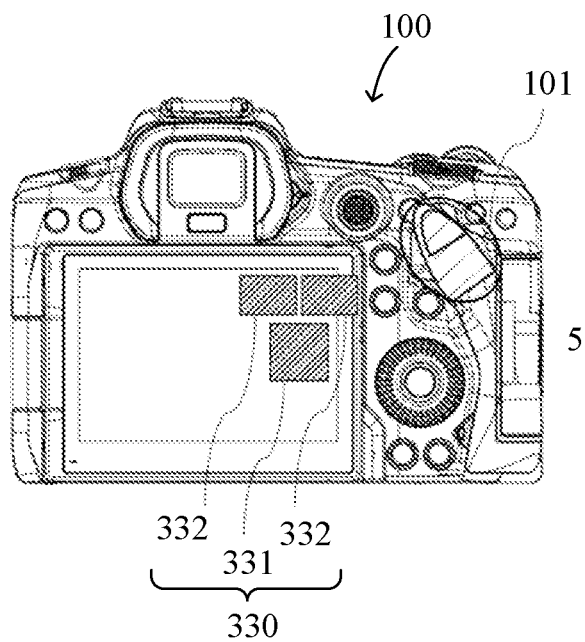
FIGS. 5A, 5B, and 5C illustrate heat radiating routes in the image pickup apparatus according to this embodiment.
Figure 5B:
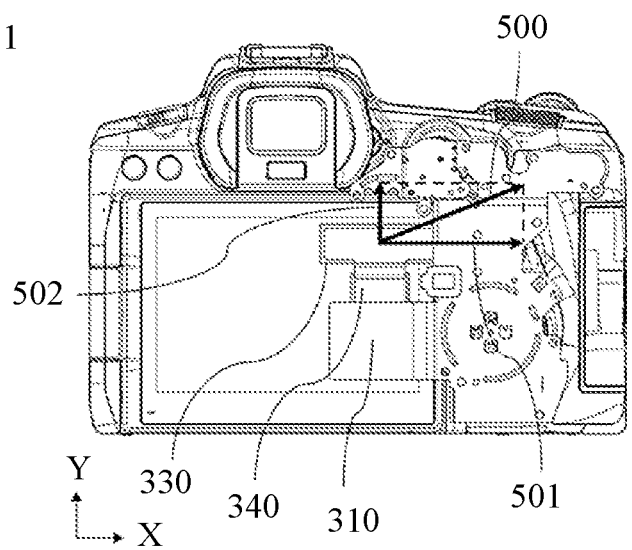
Figure 5C:
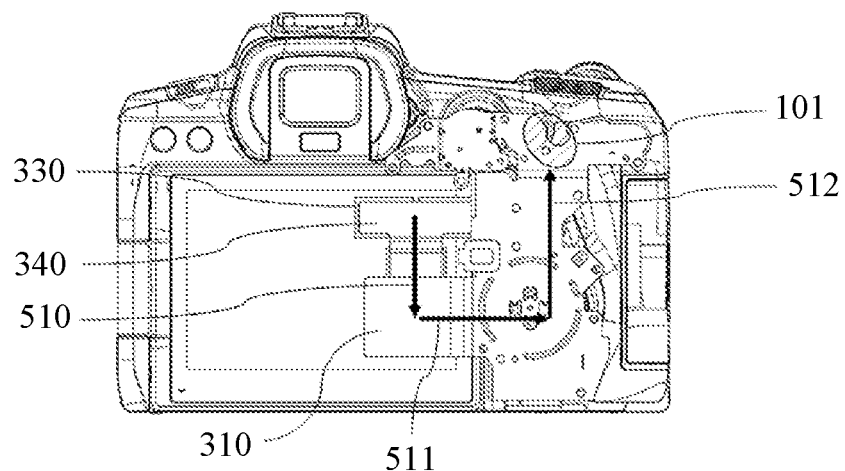

Referring now to FIGS. 5A, 5B, and 5C, a description will be given of the heat radiating route in the camera body 100. FIG. 5A illustrates the positions of the electronic component group 330 (the first electronic component 331 and the two second electronic components 332) in a case where the camera body 100 is viewed from the rear side (outside the rear cover 320 in the direction of the distance D). In the rear view, the electronic component group 330 does not overlap the held portion 101 of the rear cover 320, and heat from the electronic component group 330 is unlikely to directly transmit to the held portion 101. As illustrated in FIG. 4B, since a sufficient gap (a gap larger than D) is provided between the second electronic component 332 and the rear cover 320, the held portion 101 is less likely to get hot.

FIG. 5B illustrates the positions of the electronic component group 330, the heat conductive portion 340, and the heat radiating member 310 in a case where the camera body 100 is viewed from the rear surface side. A vector 500 indicates a direction and distance from the electronic component group 330 to the held portion 101. The vector 500 can be divided into vectors 501 and 502 in two mutually orthogonal directions, the horizontal (x-direction) and vertical (y-direction) directions.

FIG. 5C illustrates the positions of the electronic component group 330, the heat conductive portion 340, and the heat radiating member 310 in a case where the camera body 100 is seen through from the rear surface side. The heat generated from the electronic component group 330 travels through heat radiating routes indicated by vectors 510, 511, and 512 toward the held portion 101.

The heat radiating route illustrated in FIG. 5C includes a route indicated by the vector 510 in a direction reverse to the vector 502 in the y direction illustrated in FIG. 5B. More specifically, the second connector 410 of the first heat conductive member 342 is located in the opposite direction of the y-direction vector 502 with respect to the first connector 400. Thereby, the heat radiating route from the electronic component group 330 to the held portion 101 becomes longer, and heat transmitted to the held portion 101 can be prevented from excessive and the held portion 101 can be prevented from getting hot. The second connector 410 may be located in the opposite direction of the vector 501 in the X direction with respect to the first connector 400.

Although the heat radiating structure of the image pickup apparatus has been described in the above embodiment, this embodiment is applicable to a similar heat radiating structure to various electronic apparatuses other than the image pickup apparatus.

This embodiment can satisfactorily and properly radiate heat from the first and second electronic components in the electronic apparatus.

While the disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of Japanese patent application no. 2022-137282, filed on Aug. 30, 2022, which is hereby incorporated by reference herein in its entirety.

What is claimed is:

1. An electronic apparatus comprising:
an exterior member;
a first electronic component and a second electronic component each provided inside the exterior member;
a sheet metal provided inside the exterior member and spaced from each of the first electronic component and the second electronic component;
a first heat conductive member provided inside the exterior member and including a first connector thermally connected to the second electronic component and a second connector thermally connected to the sheet metal; and
an elastic member provided inside the exterior member and between the first electronic component and the sheet metal and having a thermal conductivity lower than that of the first heat conductive member,
wherein the second connector is pressed against the sheet metal by an elastic force of the elastic member.

2. The electronic apparatus according to claim 1, the elastic member includes a heat insulating member, and heat from the second electronic component is insulated from being conducted to the sheet metal by the elastic member, and
wherein the first electronic component and the second electronic component are mounted on a substrate, and a residual copper ratio of wiring in an area of the substrate where the second electronic component is mounted is smaller than that where the first electronic component is mounted.

3. The electronic apparatus according to claim 1, wherein a heat amount generated by the first electronic component is larger than that generated by the second electronic component.

4. The electronic apparatus according to claim 1, wherein a permissible upper limit temperature of the first electronic component is higher than that of the second electronic component.

5. The electronic apparatus according to claim 1, wherein a distance between the first connector and the sheet metal is longer than that between the second connector and the sheet metal.

6. The electronic apparatus according to claim 1, wherein the sheet metal is thermally connected to the exterior member, and
wherein the exterior member includes a held part for a user to hold the electronic apparatus, and the first electronic component and the second electronic component inside the exterior member are provided at positions not overlapping the held portion when the exterior member is viewed from outside in a direction of spacing.

7. The electronic apparatus according to claim 1, further comprising a second heat conductive member disposed between the first electronic component and the elastic member and having a thermal conductivity higher than that of the elastic member.

8. The electronic apparatus according to claim 6, wherein in a case where the exterior member is viewed from outside in a direction of spacing and directions from the first and second electronic components to the held portion are divided into two directions orthogonal to each other, the second connector is located opposite one of the two directions with respect to the first connector.

* * * * *